(12) United States Patent
Pitonak et al.

(10) Patent No.: US 9,636,750 B2
(45) Date of Patent: May 2, 2017

(54) COATED BODY AND METHOD FOR COATING A BODY

(71) Applicant: BOEHLERIT GmbH & Co.KG., Kapfenberg (AT)

(72) Inventors: Reinhard Pitonak, Bruck an der Mur (AT); Arno Koepf, Kapfenberg (AT); Ronald Weissenbacher, Bruck an der Mur (AT)

(73) Assignee: BOEHLERIT GmbH & Co.KG., Kapfenberg (AT)

( * ) Notice: Subject to any disclaimer, the term of this patent is extended or adjusted under 35 U.S.C. 154(b) by 22 days.

(21) Appl. No.: 14/384,945

(22) PCT Filed: Dec. 28, 2012

(86) PCT No.: PCT/AT2012/050209
§ 371 (c)(1),
(2) Date: Sep. 12, 2014

(87) PCT Pub. No.: WO2013/134796
PCT Pub. Date: Sep. 19, 2013

(65) Prior Publication Data
US 2015/0064452 A1    Mar. 5, 2015

(30) Foreign Application Priority Data
Mar. 14, 2012  (AT) ............... A 50080/2012

(51) Int. Cl.
*C23C 16/34*    (2006.01)
*B23B 27/14*    (2006.01)
(Continued)

(52) U.S. Cl.
CPC ............. *B23B 27/148* (2013.01); *B23C 5/20* (2013.01); *C23C 16/34* (2013.01); *C23C 16/44* (2013.01);
(Continued)

(58) Field of Classification Search
USPC .......... 51/307, 309; 428/216, 325, 697, 698, 428/699; 427/255.39, 255.391, 419.1,
(Continued)

(56) References Cited

U.S. PATENT DOCUMENTS 6,040,012 A * 3/2000 Anderbouhr ............ C23C 16/34
427/255.391
6,238,739 B1    5/2001 Madar
(Continued)

FOREIGN PATENT DOCUMENTS

AT    510 713    6/2012
CN    101952480 A    1/2011
(Continued)

OTHER PUBLICATIONS

Endler et al "Aluminium-rich TiAlN coatings by Low Pressure CVD" Surface & Coatinggs Techn. 205 (2010) p. 1307-1312.*
(Continued)

*Primary Examiner* — Archene Turner
(74) *Attorney, Agent, or Firm* — Greenblum & Bernstein, P.L.C.

(57) ABSTRACT

The invention relates to a body, especially a cutting element, at least partially comprising a coating, whereby the coating is formed from one or more coating layers, whereby at least one coating layer comprises aluminum, titanium and nitrogen or is formed from these elements. According to the invention, the coating layer with aluminum, titanium and nitrogen at least partially comprises lamellae having a lamellar thickness of less than 100 nm, whereby the lamellae comprise successive sections having different phases. The invention further relates to a method for coating a body, especially a cutting element.

25 Claims, 4 Drawing Sheets

Figure 1:
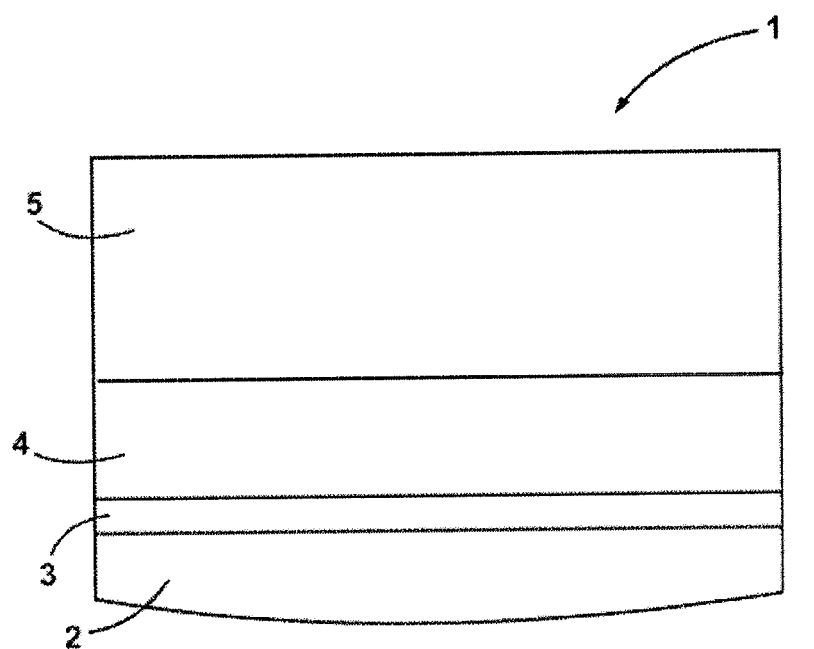

(51) Int. Cl.
*C23C 30/00* (2006.01)
*B23C 5/20* (2006.01)
*C23C 16/44* (2006.01)

(52) U.S. Cl.
CPC ........ *C23C 30/005* (2013.01); *B23B 2224/24* (2013.01); *B23C 2224/24* (2013.01); *Y10T 428/265* (2015.01)

(58) Field of Classification Search
USPC ..................................................... 427/419.7
See application file for complete search history.

(56) References Cited

U.S. PATENT DOCUMENTS

| | | | |
|---|---|---|---|
| 2003/0124363 A1 | 7/2003 | Kathrein | |
| 2006/0286410 A1 | 12/2006 | Ahlgren | |
| 2007/0141346 A1 | 6/2007 | Nordlof | |
| 2007/0160843 A1 | 7/2007 | Martensson | |
| 2008/0299366 A1 | 12/2008 | Ahlgren | |
| 2008/0299383 A1 | 12/2008 | Martensson | |
| 2009/0123779 A1 | 5/2009 | Endler | |
| 2010/0061812 A1* | 3/2010 | Ljungberg | C23C 14/022 427/248.1 |
| 2010/0135738 A1 | 6/2010 | Hedin | |
| 2010/0233511 A1 | 9/2010 | Endler | |
| 2011/0003126 A1* | 1/2011 | Van Den Berg | C23C 16/24 428/697 |

FOREIGN PATENT DOCUMENTS

| | | |
|---|---|---|
| DE | 10 2005 032 860 | 1/2007 |
| DE | 10 2007 000 512 | 1/2009 |
| EP | 0 709 483 | 5/1996 |
| EP | 1 795 628 | 6/2007 |
| EP | 2 008 743 | 12/2008 |
| JP | 59-159981 | 9/1984 |
| JP | 60-187678 | 9/1985 |
| JP | 05-337705 | * 12/1993 |
| JP | 08-127862 | 5/1996 |
| JP | 08-127863 | 5/1996 |
| JP | 2001-341008 | * 12/2001 |
| JP | 2006-281361 | 10/2006 |
| JP | 2007-190669 | 8/2007 |
| JP | 2011-104737 | 6/2011 |
| WO | WO 03/085152 | 10/2003 |
| WO | WO 2012/126030 | 9/2012 |
| WO | WO 2012/126031 | 9/2012 |
| WO | 2016/112417 | 7/2016 |

OTHER PUBLICATIONS

Endler et al Novel aluminium-rich T(1-x)Al(x)N coatings by LPCVD. Surface & Coatings Techn. 203 (2008) p. 533-540.*
Internal Search Report issued in PCT/AT2012/050209 and mailed on Aug. 28, 2013.
Austrian Office Action and Search Report issued in counterpart Austrian application No. A 50080/2012.
Endler et al., "Aluminum-rich Ti1-xAlxN coating by CVD". "Proceedings Powder Metallurgy Congress & Exibition, European Powder Metallurgy Association, Shrewsbury", vol. 1, No. 219, Oct. 25, 2006, pp. 219-224.
Chinese Office Action mailed on Jun. 16, 2015 and issued in CN Application No. 201280071438.8.
Japanese Office Action (and Translation) mailed on Jul. 27, 2016 and issued in JP Application No. 2014-561224.

* cited by examiner

COATED BODY AND METHOD FOR COATING A BODY

The invention relates to a body, especially a cutting element, at least partially comprising a coating, whereby the coating is formed from one or more coating layers, whereby at least one coating layer comprises aluminum, titanium and nitrogen or is formed from these elements.

The invention further relates to a method for coating a body, especially a cutting element, whereby a coating is applied at least regionally, the coating being formed with one or more coating layers, whereby at least one coating layer is formed from aluminum, titanium and nitrogen.

It is known from the prior art that cutting tools or cutting elements are coated with coating layers to increase the service life of a cutting element, the coating layers being composed of titanium, aluminum and nitrogen. Generally, TiAlN coating layers are often mentioned in this regard, whereby an average chemical composition is given as $Ti_{1-x}Al_xN$, irrespective of whether one or more phases are present in the coating layer. For coating layers that contain more aluminum than titanium, the nomenclature AlTiN or more precisely $Al_xTi_{1-x}N$ is customary.

The production of monophasic coating layers in the AlTiN system having a cubic structure is known from WO 03/085152 A2, whereby a cubic structure of AlTiN having a relative proportion of aluminum nitride (AlN) of up to 67 mole percent (mol %) is obtained. With higher AlN contents of up to 75 mol % a mixture of cubic AlTiN and hexagonal AlN is obtained, and exclusively hexagonal AlN and cubic titanium nitride (TiN) at an AlN content of more than 75 mol %. According to the named document, the described AlTiN coating layers are deposited by means of physical vapor deposition (PVD). With a PVD method, the maximum relative amounts of AlN are thus practically limited to 67 mol %, since otherwise it is possible to switch over completely to phases that contain aluminum only in the form of hexagonal AlN. A higher relative proportion of AlN in a cubic phase is, however, desirable according to specialist opinion, to maximize wear resistance as much as possible.

It is also known from the prior art that, instead of a PVD method the Chemical Vapor Deposition (CVD) method can be used, whereby a CVD method is carried out at relatively low temperatures in the temperature range of 700° C. to 900° C., since cubic AlTiN coating layers cannot be produced at temperatures of for example, >1000° C. due to the metastable structure of such coating layers.

If necessary, according to the U.S. Pat. No. 6,238,739 B1, the temperatures can also be still lower, namely in the temperature range from 550° C. to 650° C., whereby however high chlorine contents in the coating layer must be accepted, which proves to be disadvantageous for an application. Thus, attempts have been made to optimize the CVD process so that these AlTiN coating layers having a high proportion of aluminum with a cubic structure of the coating layer can be produced (I. Endler et al., Proceedings Euro PM 2006, Ghent, Belgium, Oct. 23-25, 2006, Vol 1 219).

Although these coating layers exhibit a high microhardness and thus, in principle, favorable properties for high wear resistance in use, it has nevertheless been proven that an adhesive strength of such coating layers can be too low. In this connection, therefore, it was proposed in DE 10 2007 000 512 B3 that a 1 μm thick coating layer that is formed as a phase-gradient layer would be provided below a cubic AlTiN coating layer that is 3 μm thick and is composed of a mixed phase of hexagonal AlN, TiN and cubic AlTiN, whereby a cubic AlTiN portion is present on the surface and/or towards the surface (exclusively) a cubic AlTiN coating layer is present in increasing proportion. Correspondingly coated cutting plates were used for milling of steel, although in comparison to coating layers that were produced by means of a PVD method, only few improvements in wear resistance were obtained.

In addition to the only slight improvement in wear resistance, there is an additional disadvantage of a bonding layer according to DE 10 2007 000 512 B3 therein, that the bonding and/or phase gradient layer grows extremely rapidly, even in laboratory-scale experiments (I. Endler et al., Proceedings Euro PM 2006, Ghent, Belgium, Oct. 23-25, 2006, Vol. 1, 219). In a production in a larger reactor that is designed for an industrial-scale coating of cutting plates, moreover, this leads to the bonding and/or phase gradient layer in the intended coating process becoming extremely thick, since a temperature for formation of the previously intended cubic AlTiN is lowered, which correspondingly requires time.

During this lowering of a process temperature, however, the thickness of the bonding- and/or phase gradient layer grows rapidly because rapid cooling is not possible in an industrial-scale reactor. It is conceivable that the coating process could be discontinued for longer periods and/or for cooling, but this is not economical.

In the manufacture of AlTiN coating layers by means of a CVD method, it has previously been assumed that wear-resistant and oxidation-resistant, and thus optimal, coating layers can be obtained if an aluminum content in the coating layer is as high as possible, and if it is possible for the coating layer to have a fully cubic structure.

In the context of the present invention, it was found that certain embodiments of an AlTiN coating layer can lead to extremely wear-resistant and oxidation-resistant coating layers without requiring an extraordinarily high aluminum content and/or a substantially cubic structure.

Accordingly, one object of the invention is to provide a body of the type mentioned above that has a coating layer that has good wear resistance and a similar oxidation resistance in use.

An additional object is to provide a method of the abovementioned type with which a body with a highly wear-resistant and oxidation-resistant coating layer can be produced.

The first object is achieved according to the invention by a body of the abovementioned type, in which the coating layer with aluminum, titanium and nitrogen at least partially comprises lamellae having a lamellar thickness of less than 100 nm, whereby the lamellae comprise successive sections having different phases.

An advantage of a body according to the invention having an at least partially lamellar structure with different phases, and a lamellar thickness of less than 100 nm is that an extremely high rigidity and thus consequently also wear resistance is provided. A lamella thus represents a succession of two phases that repeat in a grain of the coating layer.

The knowledge gained in the context of the invention appears to correlate with experiences from the PVD process. Coating layers that are produced by a PVD process often have a high rigidity, when a coating layer is formed on a body to be coated on a nanometer scale in thin layers based on a process virtually through repeated depositions. Thus, according to the invention, it is preferable for the lamellar thickness to be less than 50 nm, preferably less than 35 nm, and especially less than 25 nm.

In a coating layer of aluminum, titanium and nitrogen of a body according to the invention, generally multiple lamellae or a plurality of crystallites or grains are formed. Thus, the individual crystallites have at least partly in a cross section a width of more than 50 nm, preferably 50 to 200 nm. If the crystallite size is smaller, the effects of the lamellar structure with different phases might not fully develop.

It is especially favorable if the lamellae are formed alternately from first portions that are predominantly or exclusively composed of a cubic phase, and second portions that are predominantly or exclusively composed of a hexagonal phase. This succession of a hard, cubic phase with a softer, hexagonal phase seems to favor a desired rigidity and ultimately also a wear resistance. It is especially favorable if the first portions comprise cubic TiN and/or cubic $Al_xTi_{1-x}N$ or are composed essentially of these phases. The second portions can comprise hexagonal AlN or can be composed therefrom. It is especially advantageous if the first portions are formed with a thinner cross-section than the second portions. The interplay between succession of a hard cubic phase and a softer hexagonal phase apparently favors the rigidity due to the special design of the structure on the nanometer scale; thus, the softer hexagonal proportion should prevail.

In the coating layer with aluminum, titanium and nitrogen, a cubic TiN phase, a hexagonal AlN phase, and a cubic $Al_xTi_{1-x}N$ phase can be present, whereby aluminum is present in lower molar proportions than titanium in the hexagonal TiN phase and titanium is present in lower molar proportions than aluminum in the cubic AlN phase. Here, a portion of hexagonal AlN phase in the coating layer in total is at least 5%, preferably 5 to 50%, especially 10 to 35% (in mol %). In contrast to the expectations of the prior art, according to which the highest possible proportion of the cubic is desired in the corresponding coating layers, it is definitely favorable when a certain minimum hexagonal AlN phase content is present.

The at least one coating layer with aluminum, titanium and nitrogen is preferably deposited by means of a CVD method.

It has also proven advantageous if the at least one coating layer with aluminum, titanium and nitrogen is deposited on an additional coating layer having elongated crystals of TiCN that on average extend approximately perpendicular to the surface of the additional coating layer. On such an intermediate layer, a coating layer provided with the lamellar structure on the nanometer scale according to the invention can be formed particularly well and/or deposited with a high proportion of the desired structure. Thus the coating layers are generally deposited on a base body made of a hard metal, for example, making a cutting element available.

The object of the invention in terms of a method is achieved if, in a method of the type mentioned, the coating layer with aluminum, titanium and nitrogen at least partially comprises a lamellar structure having lamellae with a lamellar thickness of less than 100 nm, and successive portions with different phases is deposited.

An advantage realized with a method according to the invention is that a body can be provided that is formed with a wear-resistant and oxidation-resistant coating layer. This is attributed to the special design of the coating layer with aluminum, titanium and nitrogen having a lamellar structure on the nanometer scale and successive portions having different phases.

The at least one coating layer with aluminum, titanium and nitrogen is preferably deposited by means of a CVD method. In this case, the at least one coating layer with aluminum, titanium and nitrogen can be deposited simultaneously on a plurality of bodies, which allows for a very cost-effective production of, for example, cutting elements that make possible cutting plates. Here, it is preferable that a coating is carried out in a system in which the bodies are introduced simultaneously. Additional coating layers can then likewise be deposited by means of a CVD method.

Fine tuning of a lamellar structure can be achieved particularly easily if the at least one coating layer of aluminum, titanium and nitrogen is deposited at a pressure of more than 20 mbar, preferably 20 to 80 mbar. The pressure during the coating can be adjusted by supplying a process gas.

The at least one coating layer with aluminum, titanium and nitrogen is preferably deposited at a temperature of from 800° C. to 830° C. It is especially advantageous thereby if the at least one coating layer with aluminum, titanium and nitrogen is deposited from a gas phase, wherein a molar ratio of aluminum to titanium is less than 5.0, preferably less than 4.5, especially 2.5 to 4.2. By an appropriate choice of temperature and selection of a molar ratio of aluminum to titanium, a particularly extensive formation of the desired lamellar structure and crystallites having a size of approximately 80 to 200 nm can be achieved.

Figure 2:
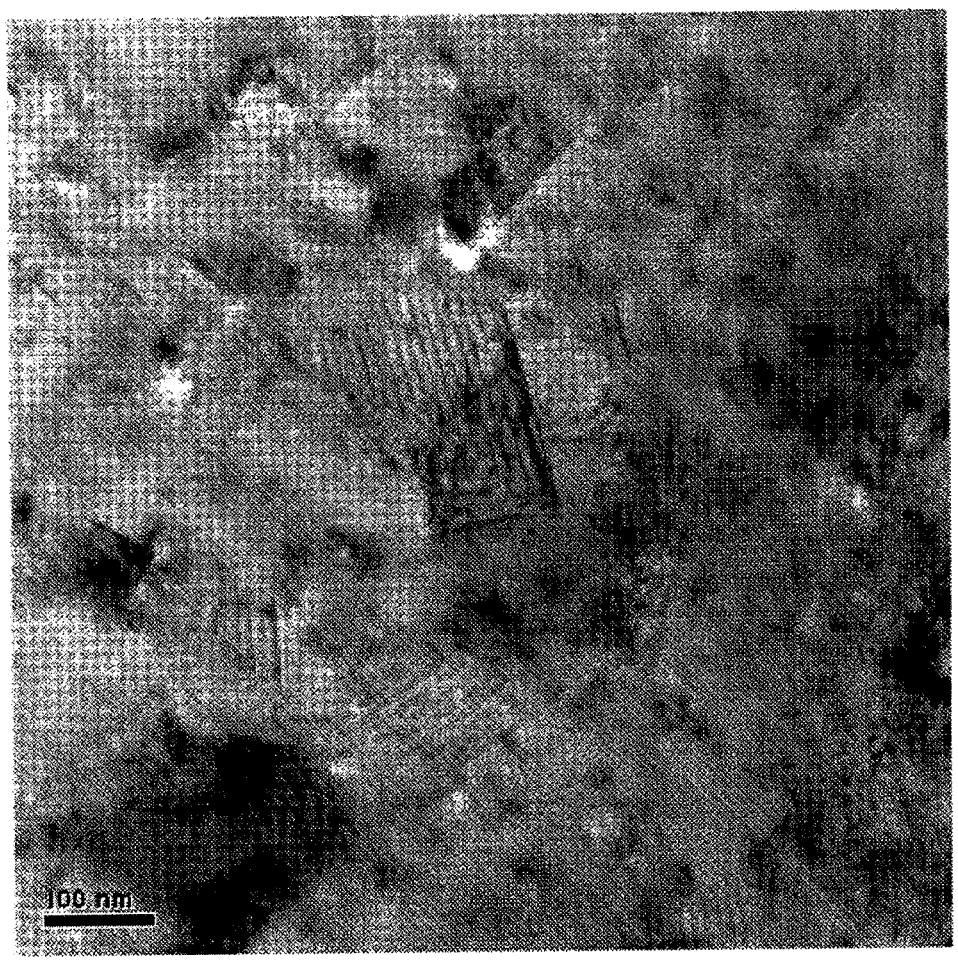
Figure 3:
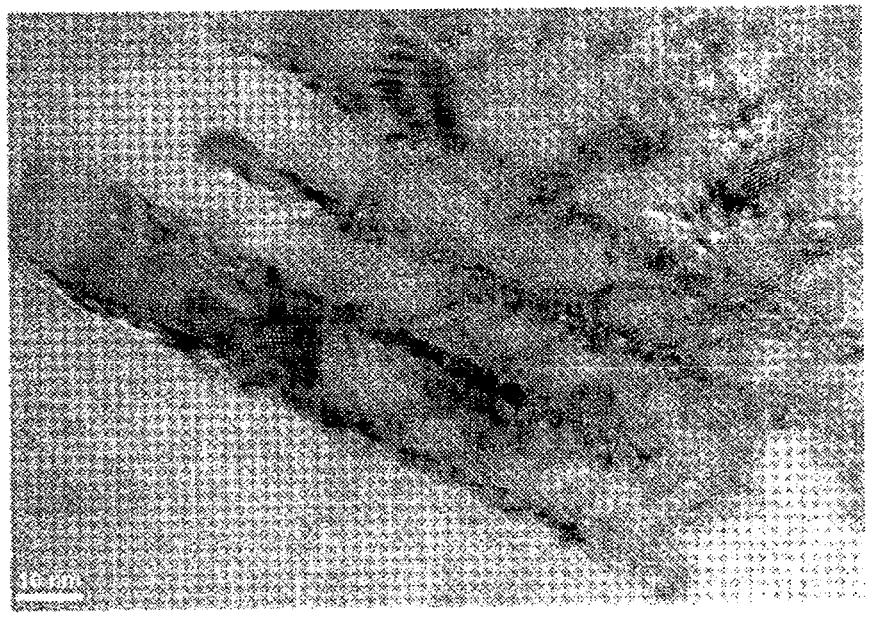
Figure 4:
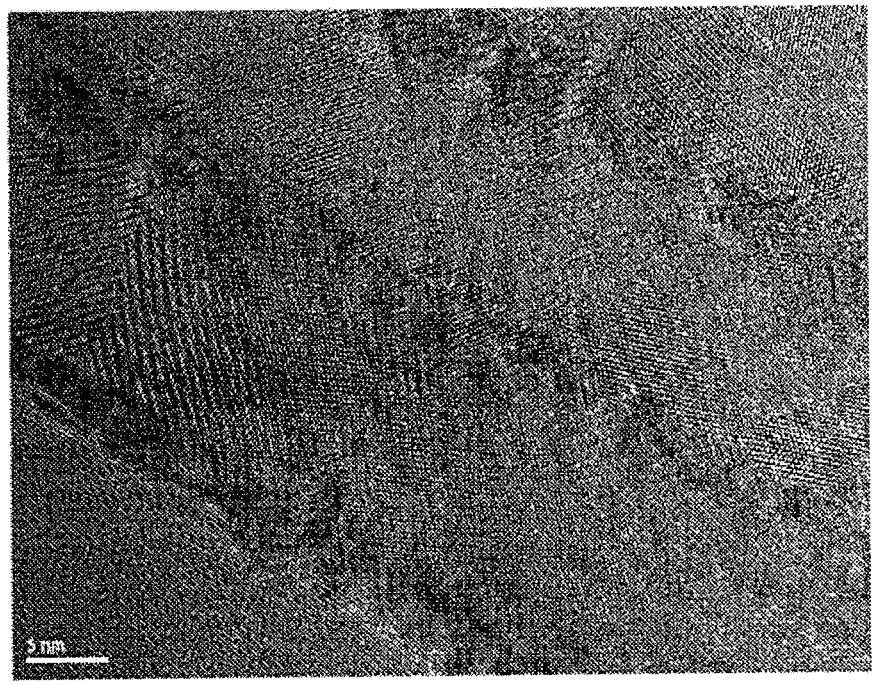
Figure 5:
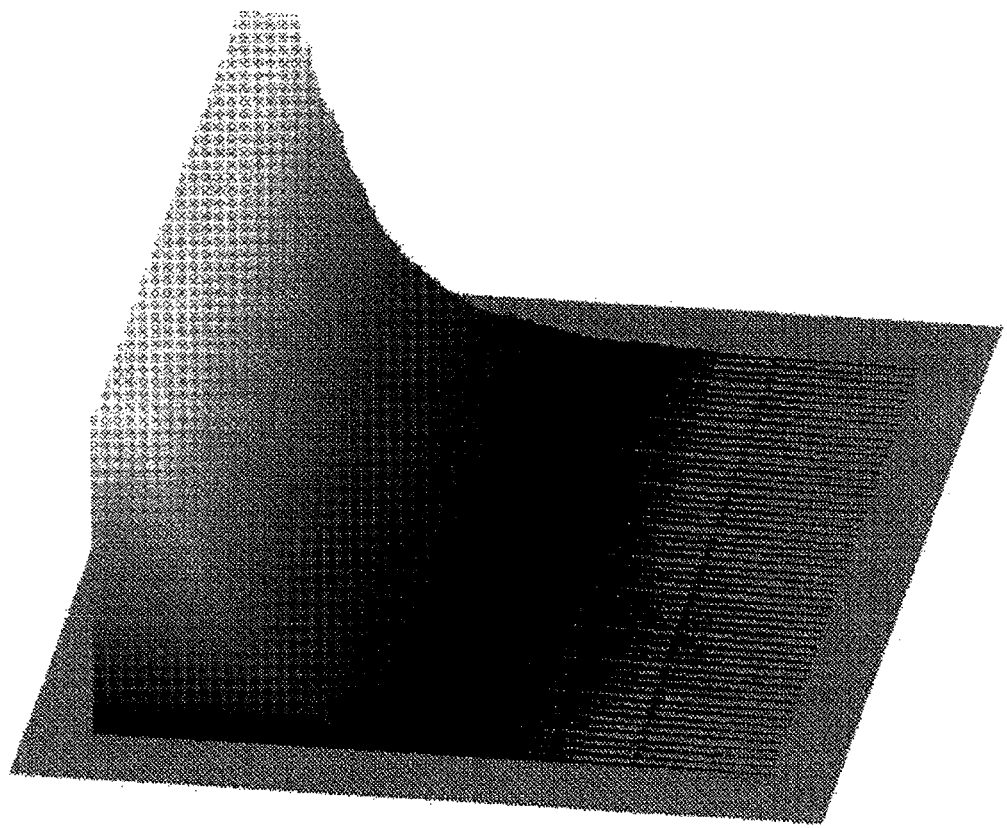

The invention is further explained in the following with reference to an embodiment. In the drawings, to which reference is made here, is shown:

In FIG. 1, a schematic view of a coated body;

In FIG. 2, a photograph of a coating layer of a body according to FIG. 1 taken with a transmission electron microscope;

In FIG. 3, an enlarged detail from the representation in FIG. 2;

In FIG. 4, an enlarged detail from the representation in FIG. 3;

In FIG. 5, a representation of a chemical analysis by means of transmission electron microscopy.

FIG. 1 shows a body (1) according to the invention. The body (1) comprises a base body (2), which is usually composed of a hard metal, which is selected from carbides and/or carbonitrides of tungsten, titanium, niobium or other metals, and a binder metal selected from the group cobalt, nickel and/or iron. As a rule, a binder metal content is up to 10 wt %. Typically, the body (1) is composed of up to 10 wt % of cobalt and/or other binder metals, the remainder being tungsten carbide, and up to 5 wt % of other carbides and/or carbonitrides of other metals. A coating layer (3) of TiN serving as a bonding layer is deposited on the base body (2). The coating layer (3) typically has a thickness of less than 2 μm, preferably 0.4 to 1.2 μm. A coating layer (4) of TiCN serving as an intermediate layer is deposited on the coating layer (3). This coating layer (4) is a medium-temperature TiCN (MT-TiCN) coating layer. Such a coating layer (4) typically has a columnar structure with columnar crystals, which are aligned substantially parallel to the surface normal to the body (1). Finally, an outermost coating layer (5) is deposited on the coating layer (4). The coating layer (5) is formed with aluminum, titanium and nitrogen, and is deposited by means of a CVD method as with the other coating layers (3) and (4). Depending on the procedure and gases used, smaller proportions of chlorine and oxygen can also be present in the coating layer (5).

A coating as shown in FIG. 1 can be deposited on a cutting element, in particular a cutting plate, wherein the body (1) is prepared, whereby in a first step the bonding layer and/or coating layer (3) of TiN is deposited at a process temperature of from 880° C. to 900° C. from a gas containing nitrogen, hydrogen and titanium tetrachloride. Then the temperature is lowered, and at a temperature from 830 to 870° C. a coating layer (4) formed from MT-TiCN having a thickness of 2-5 µm is deposited. The deposition is thus carried out from a gas composed of nitrogen, hydrogen, acetonitrile, and titanium tetrachloride. The corresponding process temperature and the use of acetonitrile as the carbon and/or nitrogen source ensures formation of the intermediate layer with columnar growth and/or columnar crystals of TiCN.

The TiCN coating layer thus has longitudinally extending crystals in cross-section, which preferably extend predominantly at an angle of ±30° to a surface normal of the body (1). A corresponding TiCN coating layer produces a good bonding of the subsequently deposited coating layer (5) with an average $Al_xTi_{1-x}N$. In this regard, it is advantageous for the TiCN coating layer to have an average composition of $TiC_aN_{1-a}$ with a in the range of 0.3 to 0.8, especially 0.4 to 0.6.

To enhance a hardness, finally the coating layer (5) with aluminum, titanium and nitrogen can be applied to the intermediate layer of TiCN, whereby the titanium can be replaced by up to 40 mole % aluminum, whereby the temperature is lowered to about 800° C. to 830° C. The coating layer (5), which is, but need not be, an outermost coating layer, is prepared from a gas containing aluminum trichloride, nitrogen, hydrogen, titanium tetrachloride, and a separately supplied mixture of ammonia and nitrogen. Thus, in a second step for producing the intermediate layer and in a third step for producing the coating layer (5), each can have a lowered process temperature, which is highly economical and allows for rapid preparation of the coating on the cutting element.

For the production of coated bodies (1), a respective plurality of bodies (1) is introduced into a system where coating takes place simultaneously in the manner described above. A process pressure in the CVD coating steps is thus adjusted through the supply of the process gas. During production of the coating layer (5) with aluminum, titanium and nitrogen, a molar ratio of aluminum to titanium is adjusted such that that it is less than 5.0.

The following tables show typical process parameters for the production of a coating and properties of individual coating layers.

TABLE 1

Process parameters

| Coating layer | Temperature (° C.) | Gas composition/gas flow rate (L/min) and/or TiCl$_4$ and CH$_3$CN (mL/min) |
|---|---|---|
| TiN | 880-900 | TiCl$_4$/2.7, N$_2$/14, H$_2$/17 |
| MT-TiCN | 830-870 | CH$_3$CN/0.5, TiCl$_4$/2.7, N$_2$/19, H$_2$/3 |
| AlTiN | 800-830 | HCl—AlCl$_3$/2.7-0.7, TiCl$_4$/0.3, NH$_3$—N$_2$/0.9-4.5, H$_2$/64 |

TABLE 2

Properties of the coating layers

| Coating layer | Layer thickness (µm) General | Layer thickness (µm) Preferred | Composition |
|---|---|---|---|
| TiN | ≤2 | 0.25-0.75 | TiN |
| MT-TiCN | 1-10 | 2-5 | TiC$_a$N$_{1-a}$, a = 0.4-0.6 |
| AlTiN | 1-10 | 3-8 | Al$_x$Ti$_{1-x}$N, x = 0.80-0.99 |

FIGS. 2 to 4 show transmission electron micrographs of the outermost coating layer (5) with different resolution. As can be seen in FIG. 2, lamellar structures are present in the coating layer (5), which are visible partially in cross-section. It is assumed that these are individual crystallites that are differently aligned with respect to the viewing direction, so that the lamellar structure is fully visible only for individual, suitably positioned crystallites. According to the cross-section, the crystallite size is approximately 50 to 200 nm.

FIG. 3 shows an enlarged detail of a region according to FIG. 2. As can be seen, individual lamellae are formed. A lamella respectively comprises a first portion that appears darker in FIG. 3 and a thicker second section that appears brighter. A plurality of such lamellae in a crystallite follow each after the other with a lamellar thickness, namely the thickness of the sum of a first portion and a second portion, of less than 25 nm. The first sections are composed of cubic TiN that can have lower proportions of aluminum, whereby the molar fraction of aluminum is preferably a maximum of 10% of the titanium content. The thicker second portions are formed from a hexagonal phase, which in terms of metals predominantly comprises aluminum. In addition, an $Al_xTi_{1-x}N$ phase is still present in the coating layer, wherein the aluminum content far outweighs the titanium content. Thus, a total of three phases are present, whereby two of the phases form a lamellar structure that is shown enlarged in FIG. 4.

It is confirmed through chemical analysis by means of transmission electron microscopy that the thinner, first portions of the lamellae are formed predominantly with titanium as the metal (the darker regions in FIG. 5), whereas in the thicker, second portions aluminum is the predominant metal (lighter regions in FIG. 5).

Cutting elements with a coating layer (5) as described previously have proven in use especially for the machining of cast materials, but also other metallic materials, to be extremely wear-resistant and oxidation resistant, whereby individual cases have shown service life increases of up to 220% as compared with cutting plates that were coated with a cubic $Al_xTi_{1-x}N$ coating layer using a PVD method.

The invention claimed is:

1. A body comprising:
   a single CVD coating layer at least partially arranged on the body; and
   said single CVD coating layer being at least partially lamellar and comprising aluminum, titanium and nitrogen,
   wherein lamellae of the single CVD coating layer comprises:
   a lamellar thickness of less than 100 nm; and
   successive portions with different phases.

2. The body of claim 1, wherein the body is a cutting element.

3. The body of claim 1, wherein the lamellar thickness is less than 50 nm.

4. The body of claim 3, wherein the lamellar thickness is one of:
   less than 35 nm; and
   less than 25 nm.

5. The body of claim 1, wherein the lamellae form crystallites having at least partially in one cross section a width of more than 50 nm.

6. The body of claim 5, wherein the width is between 50 to 200 nm.

7. The body of claim 1, wherein the lamellae comprise alternately formed first and second portions, said first portions being predominantly or exclusively composed of a cubic phase, and said second portions being predominantly or exclusively composed of a hexagonal phase.

8. The body of claim 7, wherein the first portions comprise cubic TiN and/or cubic $Al_xT_{1-x}N$.

9. The body of claim 7, wherein the second portions comprise hexagonal AlN.

10. The body of claim 7, wherein the first portions are thinner in cross section than the second portions.

11. The body of claim 1, wherein said single CVD coating layer comprises the following:
a cubic TiN phase;
a hexagonal AlN phase; and a cubic $Al_xTi_{1-x}N$ phase,
whereby, in the cubic TiN phase, aluminum is present in lower molar proportions than titanium, and
whereby, in the hexagonal AlN phase, titanium is present in lower molar proportions than aluminum.

12. The body of claim 11, wherein a proportion of the hexagonal phase of AlN is at least 5%.

13. The body of claim 12, wherein the proportion of the hexagonal phase of AlN is one of:
between 5% and 50%; and
between 10% and 35%.

14. The body of claim 1, wherein the single CVD coating is arranged over another coating layer comprising elongated crystals of TiCN that on average extend approximately perpendicular to a surface of the other coating layer.

15. The body of claim 1, wherein the body is a hard metal base body.

16. A method for coating a body with a single CVD coating layer having an at least partially lamellar structure and comprising aluminum, titanium and nitrogen, the method comprising:
applying, at least regionally, said single CVD coating layer on the body,
wherein lamellae of the single CVD coating layer comprise:
a lamellar thickness of less than 100 nm; and
successive sections with different phases.

17. The method of claim 16, wherein the body comprises plural bodies.

18. The method of claim 17, wherein the applying occurs in a system into which the plural bodies are introduced simultaneously.

19. The method of claim 16, wherein the applying occurs at a pressure of more than 20 mbar.

20. The method of claim 19, wherein the pressure is between 20 and 80 mbar.

21. The method of claim 19, further comprising adjusting the pressure during the applying.

22. The method of claim 16, wherein the applying occurs at a temperature of from 800° C. to 830° C.

23. The method of claim 16, wherein the applying comprises depositing from a gas phase the at least one coating layer, wherein a molar ratio of aluminum to titanium is less than 5.0.

24. The method of claim 23, wherein the molar ratio of aluminum to titanium is one of:
less than 4.5; and
between 2.5 and 4.2.

25. A cutting tool element comprising:
a metal body;
plural coating layers arranged on the body;
said plural coating layers comprising a single CVD outermost layer;
said single CVD outermost layer comprising aluminum, titanium and nitrogen, and having an at least partially lamellar structure,
wherein lamellae of said single CVD coating layer comprise:
a lamellar thickness of less than 100 nm; and
successive portions with different phases.

* * * * *